United States Patent
Moriya et al.

(10) Patent No.: US 6,963,593 B2
(45) Date of Patent: Nov. 8, 2005

(54) SEMICONDUCTOR LASER MODULE AND OPTICAL TRANSMITTER

(75) Inventors: Hiroshi Moriya, Yokohama (JP); Kisho Ashida, Yokohama (JP); Toshiaki Ozaki, Yokohama (JP)

(73) Assignee: OpNext Japan, Inc., Yokohama (JP)

( * ) Notice: Subject to any disclaimer, the term of this patent is extended or adjusted under 35 U.S.C. 154(b) by 9 days.

(21) Appl. No.: 10/632,350

(22) Filed: Jul. 31, 2003

(65) Prior Publication Data

US 2004/0066814 A1 Apr. 8, 2004

(30) Foreign Application Priority Data

Oct. 4, 2002 (JP) ........................................ 2002-291806

(51) Int. Cl.$^7$ .............................. H01S 5/00; H01S 3/04
(52) U.S. Cl. ........................................... 372/36; 372/43
(58) Field of Search ............................. 372/34–36, 43, 372/108

(56) References Cited

U.S. PATENT DOCUMENTS

| | | | | |
|---|---|---|---|---|
| 6,697,399 B2 | * | 2/2004 | Kimura et al. | 372/36 |
| 6,826,212 B2 | * | 11/2004 | Shirai et al. | 372/36 |
| 2001/0001622 A1 | * | 5/2001 | Tatoh | 385/94 |
| 2002/0003819 A1 | * | 1/2002 | Kimura et al. | 372/36 |
| 2002/0025126 A1 | * | 2/2002 | Finot et al. | 385/92 |
| 2002/0060840 A1 | * | 5/2002 | Tatoh | 359/341.1 |
| 2002/0167977 A1 | * | 11/2002 | Nakabayashi et al. | 372/36 |
| 2003/0053499 A1 | * | 3/2003 | Shinkai et al. | 372/36 |
| 2003/0156800 A1 | * | 8/2003 | Verdiell et al. | 385/88 |
| 2003/0161360 A1 | * | 8/2003 | Johnson | 372/20 |

FOREIGN PATENT DOCUMENTS

| | | |
|---|---|---|
| JP | HEI 11-74395 | 3/1999 |
| JP | HEI 11-74619 | 3/1999 |
| JP | 2001-60735 | 3/1999 |
| JP | HEI 11-163184 | 6/1999 |
| JP | 2001-28407 | 1/2001 |
| JP | 2001-60735 | 3/2001 |
| JP | 2002-72024 | 3/2002 |

* cited by examiner

*Primary Examiner*—Wilson Lee
*Assistant Examiner*—Hung Tran Vy
(74) *Attorney, Agent, or Firm*—Townsend and Townsend and Crew LLP

(57) ABSTRACT

For preventing an optical axis from shifting due to a heat cycle in a semiconductor laser module, or in a optical transmitter, the semiconductor laser module comprises, a semiconductor laser element, a frame for storing the semiconductor laser element therein, an optical fiber fixing portion being connected to the frame; and a flange being connected to the frame, and having a fixing portion for fixing the frame on a substrate, wherein the flange has a narrow width region between a fixing region, including a foxing portion with the substrate therein, and the frame, and the narrow width region is narrower than width of the fixing region.

10 Claims, 8 Drawing Sheets

SEMICONDUCTOR LASER MODULE AND OPTICAL TRANSMITTER

BACKGROUND OF THE INVENTION

The present invention relates to a semiconductor laser module for mounting an optical semiconductor device into an inside thereof, and it also relates to an optical transmitter with using the semiconductor laser module therein.

An optical transmitter is used for transmitting a light with using a semiconductor laser therein, wherein a semiconductor module mounting a semiconductor laser is mounted on a substrate for use of heat radiation. For developing such the optical transmitter, it is necessary to obtain incidence and coupling of a light emitted from the semiconductor laser element with high efficiency (i.e., without causing a shift with respect to an optical axis). Relating to this, there are already known the following patent document:

Japanese Patent Laying-Open No. Hei 11-74395 (1999) <JP-A 11-74395> mentioned below discloses the module, comprising a frame made of metal, insulating material, or a complex of metal and insulating material, and a first bottom plate fixed on the frame and a second bottom plate fixed on the first bottom plate.

Also, Japanese Patent Laying-Open No. Hei 11-163184 (1999) <JP-A 11-163184> discloses therein that the semiconductor laser module is restricted in thickness of a screw portion and the substrate thereof, so as to take countermeasure against mismatching in the position that is caused when screwing the semiconductor device. And also, Japanese Patent Laying-Open No. 2001-28407 (2001) <JP-A 2001-28407> discloses provision of screw portions, projecting into an outside at a center along a long side of the substrate, so as to prevent the positional alignment of a semiconductor element and an optical filer from being out of order through the screw fixing. Further, Japanese Patent Laying-Open No. 2001-60735 (2001) <JP-A 2001-60735> discloses the provision of screw portions on both short sides of the substrate, so as to prevent an optical fiber from shifting in the optical axis when being fixed by the screw, and also that an optical fiber fixing member is disposed on one of the long sides of a frame while a reed terminal member on the other side thereof, for the purpose of preventing the optical fiber from shifting in the optical axis thereof when being fixed by the screw, etc. Furthermore, Japanese Patent Laying-Open No. Hei 11-74619 (1999) <JP-A 11-74619> discloses bonding of screw member made of a material, such as, metal, being equal or less than 200 GPa in the Young's modulus and equal or less than 500 MPa in yield stress, on a metal substrate and a metal frame constructing a package for use of an optical semiconductor, while projecting from the metal substrate and the metal frame.

In Japanese Patent Laying-Open No. 2002-72024 (2002) <JP-A 2002-72024>, shifting of the optical axis caused when fixing by the screw is dissolved, by flattening the bottom surfaces of a frame and a flange portion through gliding process.

[Patent Document 1]
Japanese Patent Laying-Open No. Hei 11-74395 (FIG. 1 and the explanation thereof)

[Patent Document 2]
Japanese Patent Laying-Open No. Hei 11-163184 (FIG. 1 and the explanation thereof)

[Patent Document 3]
Japanese Patent Laying-Open No. 2001-28407 (FIG. 1 and the explanation thereof)

[Patent Document 4]
Japanese Patent Laying-Open No. 2001-60735 (FIG. 1 and the explanation thereof)

[Patent Document 5]
Japanese Patent Laying-Open No. Hei 11-74619 (FIG. 1 and the explanation thereof), and

[Patent Document 6]
Japanese Patent Laying-Open No. 2002-72024 (FIG. 1 and the explanation thereof)

However, when mounting a semiconductor laser module on a heat radiation substrate, for building up a semiconductor laser transceiver, for example, and in particular, when driving the laser, the laser element generates heat, thereby generating thermal stress due to difference in the coefficient of linear expansion between the semiconductor laser module and the substrate for use of heat radiation thereof, and the thermal stress is also generated due to the change of temperature in the environments therearound. As a result of study made by the inventors earnestly, it causes to appear that it is difficult to dissolve the drawbacks, sufficiently, in accordance with the technologies disclosed in the documents mentioned above, such the shifting in the optical axis that is caused due to the thermal stress, which is generated with driving of the laser module.

BRIEF SUMMARY OF THE INVENTION

Therefore, an object according to the present invention is to dissolve such the drawbacks mentioned above.

For dissolving such the drawbacks mentioned above, according to the present invention, the following are proposed, so as to suppress the shifting in the optical axis after installation of the laser module, with high efficiency.

(1) A semiconductor laser module, comprising: a semiconductor laser element; a frame for storing said semiconductor laser element therein; an optical fiber fixing portion being connected to said frame; and a flange being connected to said frame, and having a fixing portion for fixing said frame on a substrate, wherein said flange has a narrow width region between a fixing region, including a fixing portion with said substrate therein, and said frame, and said narrow width region is narrower than width of said fixing region.

(2) The semiconductor laser module, as defined in the above (1), wherein: said frame has a polygonal shape, said flange has a first flange connecting to a first main side of said frame and a second flange connecting to a second main side of said frame opposing to said first main side thereof, said first flange is provided in a first region on said first main side, which is divided by an elongated line of a line connecting a portion where said semiconductor laser element is disposed and a portion where an optical fiber of said optical fiber fixing portion is disposed, while no flange is provided in a second region located on a reverse side of said first region, and no flange is provided in a third region located on the second main side of said frame on a side of said first region, opposing to said first main side, while said second flange is provided in a fourth region located on a side of said second region.

(3) The semiconductor laser module, as defined in the above (1), wherein: said frame has a polygonal shape, said flange has a first flange connecting to a first main side of said frame and a second flange connecting to a second main side of said frame opposing to said first main side thereof, the connecting portion of said first flange to said frame and said connecting portion of said first flange are disposed in a first region on said first main side, which is divided by an elongated line of a line connecting a portion where said semiconductor laser element is disposed and a portion where an optical fiber of said optical fiber fixing portion is disposed, the connecting portion of said second flange to said frame and said connecting portion of said second flange are disposed in a fourth region, locating at a side of said second region on the second main side of said frame opposing to said first side thereof.

(4) The semiconductor laser module, as defined in the above (1), wherein: said frame has a polygonal shape, said flange has a first flange connecting to a first main side of said frame and a second flange connecting to a second main side of said frame opposing to said first main side thereof, the connecting portion of said first flange to said frame and said fixing portion of said first flange are provided in a first region on said first main side, which is divided by an elongated line of a line connecting a portion where said semiconductor laser element is disposed and a portion where an optical fiber of said optical fiber fixing portion is disposed, and the connecting portion of said second flange to said frame and said fixing portion of said flange are provided in a fourth region located on a side of said second region on the second main side of said frame, opposing to said first main side.

(5) The semiconductor laser module, as defined in the above (1), wherein said fixing region and said narrow width region are so formed that difference between those on a side surface of said flange at a side far from said semiconductor element is larger than that between said fixing region and said narrow width region on the side surface of said flange at a side near to said semiconductor element.

BRIEF DESCRIPTION OF THE SEVERAL VIEWS OF THE DRAWING

Those and other objects, features and advantages of the present invention will become more readily apparent from the following detailed description when taken in conjunction with the accompanying drawings wherein.

DETAILED DESCRIPTION OF THE INVENTION

Figure 1:
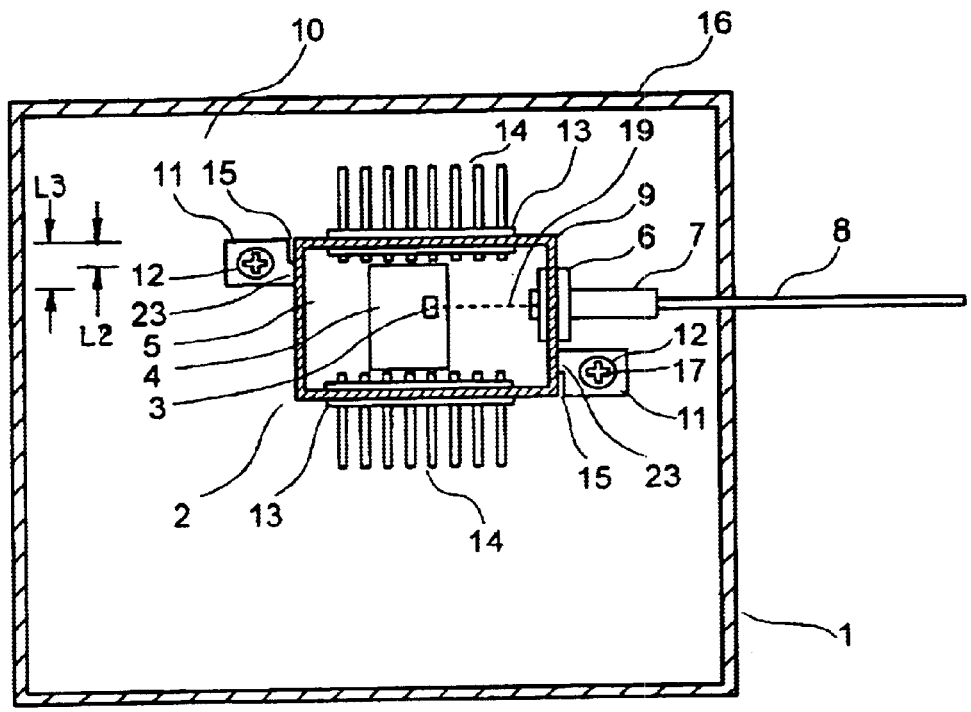
FIG. 1 is a plane view for showing an optical transmitter, according to an embodiment of the present invention.

Hereinafter, explanation will be given in a semiconductor laser element and a producing method thereof, according to the respective embodiments of the present invention, by referring to the drawings attached. However, in each of the drawings, for the purpose of preventing them from confusion thereof, illustration is omitted, appropriately, in a portion of some parts and/or adhesive-bonding material, etc. Also, the present invention should not be restricted only to the embodiment disclosed in the present specification, and it should not be prevented from being applied into the conventional technology and that, which is newly created.

<Embodiment 1>

Figure 2:
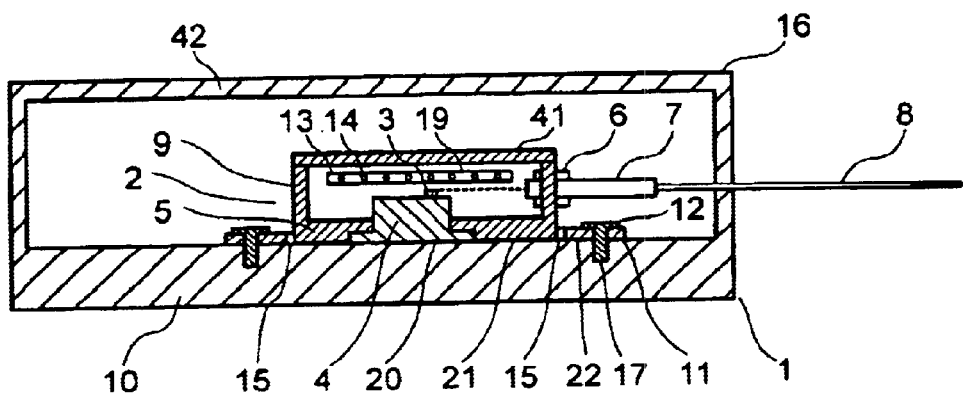
FIG. 2 is a cross-section view for showing a principle portion of the same optical transmitter.
Figure 3A:
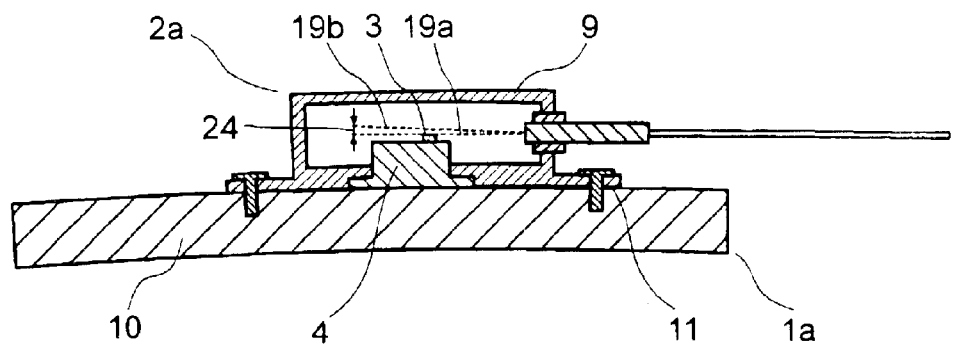
FIGS. 3(a) and 3(b) are cross-section views for showing a thermal change in the optical transmitter.
Figure 4:
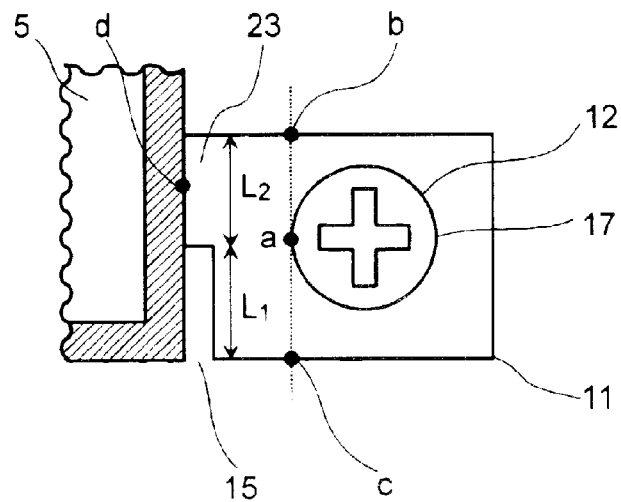
FIG. 4 is an enlarged view for showing a flange portion of a semiconductor laser module, according to the first embodiment of the present invention.
Figure 5:
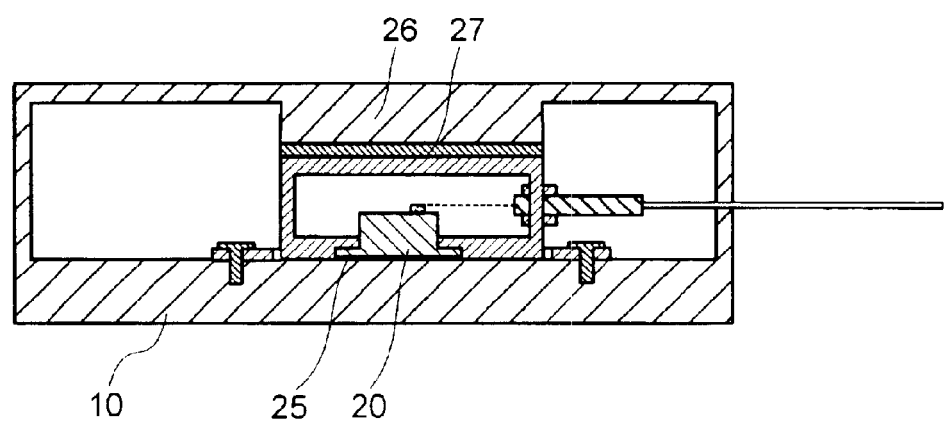
FIG. 5 is a cross-section view for showing the principle portion of the optical transmitter, according to the first embodiment of the present invention.

Explanation will be given on an optical transmitter, according to a first embodiment of the present invention, by referring to FIGS. 1 to 5. Herein, FIG. 1 is a plane view for showing the optical transmitter according to the first embodiment of the present invention, and FIGS. 2 and 5 are cross-section views of the principle portion thereof. Also, FIG. 3(a) is a view for showing the thermal deformation in the optical transmitter of the conventional art, and FIG. 3(b) a view for showing the thermal deformation in the optical transmitter according to the present embodiment. Also, FIG. 4 is a view for showing an example of notch formed in a flange portion of a the semiconductor laser module, in the optical transmitter according to the present embodiment.

In the optical transmitter 1 according to the present embodiment, as is shown in FIGS. 1 to 2, a semiconductor laser module 2 is mounted on a substrate for us of heat radiation therefrom (hereinafter, being called by "heat radiation substrate) and is packaged by means of a housing 16. The above semiconductor module 2 has a stem 4 mounting a semiconductor laser element 3 thereon, an optical fiber 8 for transmitting a laser light emitted from the semiconductor laser element 3 into an inside, and fiber fixing portions 6 and 7 for fixing the optical fiber on a frame 9, wherein the stem 4 and the frame 9, which are used as the substrate for mounting the semiconductor laser element thereon, are connected with, respectively, through brazing material, such as, silver brazing, etc. Above the upper portion of the semiconductor laser element 3, a frame cover potion 41 is formed covering over the semiconductor laser element 3.

Also, the stem member has a function for effectively directing heat generated by the LD when driving the LD into the heat radiation substrate, and therefore it is preferable to be made of a material having thermally high heat conductivity. However, in general, the material having good heat conductivity has also a large coefficient of linear expansion, therefore if using the material of high heat conductivity as a material of the stem, simply, the difference from the coefficient of linear expansion of the LD comes to be large, thereby generating stress which causes defects in the LD. Then, a material having large heat conductivity and having a small difference with respect to the LD in the coefficient of linear expansion is used as the material of the stem, however such the material is expensive, therefore it is necessary to make such the material as small as possible in an amount of use thereof. In the optical transmitter 1 shown in the embodiment 1, a hole portion is formed on the substrate, so that the stem is directly connected onto the heat radiation substrate 10, and therefore the heat generated when driving the LD flows from the stem into the heat radiation substrate. Accordingly, it is not necessary to use such a material having large one as that of the stem, in the heat conductivity thereof, as a material of the substrate; therefore it is possible to save the material cost, thereby resulting into cost reduction.

Also, a reed terminal 14 is provided for electrical connection between the semiconductor laser element 3 and an outside circuit, and this reed terminal 14 is fixed on a side surface of the frame 9 through an insulating material 13, such as, aluminum oxide, etc.

Also, on a side surface of the frame 9 are formed flanges 11 for connecting the substrate (for example, the heat radiation substrate 10) and the semiconductor module 2 by means of a screw 17 as the fixing member, on which a tapped hole 12 is formed as a fixing portion. The substrate 10 has a substrate cover portion 42 covering over the frame 9, in the above thereof.

The semiconductor module 2 mounting the optical transmitter 1 thereon has a notch 15 for defining a narrow width region, which is formed in a root or base portion of the flange mentioned above, as shown in FIG. 1. With forming of this notch in the base portion of that flange, thereby forming the narrow width region, the rigidity of the base portion mentioned above is made to be smaller than those of the said substrate and the said frame, with respect to deforming in the horizontal direction along with the substrate 10. Herein, the rigidity mentioned above indicates a difficulty of movement of a point "d" while keeping points "a" and "b" fixed, in assuming that the point "d" is a center of a boundary portion between the flange base portion and the frame, and that "b" and "c" are at the points where a straight line, being orthogonal to an optical axis passing through the point "a" at the most nearest to the frame in the vicinity of the screw 17 shown in FIG. 4, comes across a side portion of the flange portion.

The flange 11 has the narrow width region between a fixing region, including therein the fixing portion with the heat radiation substrate 10, and the frame 9, being narrower than the fixing region mentioned above.

Figure 3B:
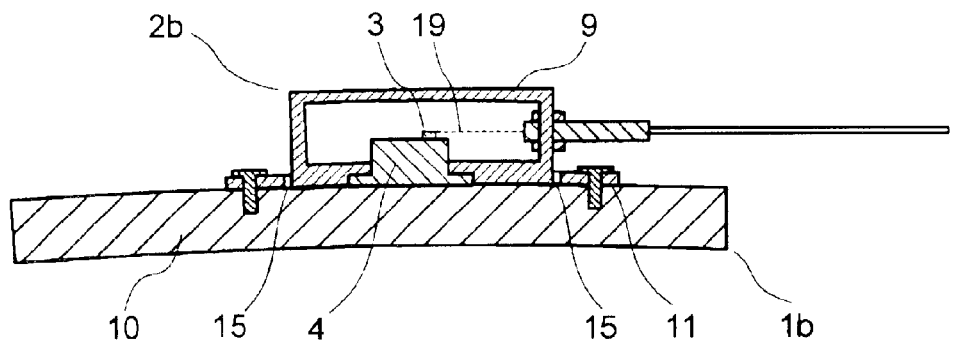

FIG. 3(a) shows the thermal deformation in an optical transmitter having no such the narrow width region in the flange thereof, as a comparison example, and FIG. 3(b) the thermal deformation in the optical transmitter comprising the narrow width region, according to the present embodiment mentioned above. In the conventional optical transmitter 1a, as is shown in FIG. 3(a), the semiconductor laser module 2 tries to deform or bend downward in a concave-like manner or shape due to the difference in the coefficient of linear expansion between the iron-nickel-cobalt alloy ($\alpha 1 = 5.3 \times 10^{-6}/C.°$) building up the frame 9 and Cuw ($\alpha 2 = 8.3 \times 10^{-6}/C.°$) building up the stem, when environmental temperature is high in the use thereof, or when the semiconductor laser element is driven, thereby generating heat therefrom. And further, the heat radiation substrate 10 ($\alpha 3 = 23 \times 10^{-6}/C.°$) also tries to deform or bend downward due to the difference in the coefficient of linear expansion from the semiconductor module 2. In addition thereto, since also rotary moment is added onto the frame in the horizontal direction along the substrate, the deformation of the frame 9 comes to be large if not possible to absorb that rotary moment, thereby causing difference in position between the laser emission direction 19a and the fiber connect direction 19b (i.e., an optical axis shifting 24).

On the other hand, in the optical transmitter according to the present invention, as is shown in FIG. 3(b), because of forming of the notch 15 in the flange portion, the rigidity of the flange is weak, in particular, to the rotary moment in the horizontal direction along the substrate, on which the flange is fixed. With this, the flange base portion 23 absorbs the deformation due to the rotary moment, and therefore it is possible to suppress the semiconductor module 2 from being promoted in bending thereof. And according to this, the frame can be prevented from such the deformation, and the direction of laser emission and the fiber connection direction are combined or aligned with each other, thereby protecting the optical axis from generating the shifting therein.

In the similar manner, in the case where the temperature is high in the environment of use of the optical transmitter 1, the semiconductor module 2 tries to deform or bend upward in a convex-like shape, and further, also the heat radiation substrate 10 tries to deform or bend upward in the convex-like shape due to the difference in the coefficient of linear expansion of the semiconductor module 2, thereby generating a rotary moment in the opposite direction thereof. However, since the notch 15 is formed in the flange portion, the rotary moment mentioned above is absorbed, sufficiently, by means of the flange having the narrow width region in the flange base portion 23, and the semiconductor module 2 can be prevented from being promoted in bending, with an aid of bending of the heat radiation substrate 10, thereby protecting the optical axis from shifting therein.

Also, as is shown in FIGS. 1 and 4, it is preferable to form the notch on the opposite side of the flange with respect to the optical axis 9. Thus, a connecting portion of the flange with the frame 9 is formed on the side near to the optical axis 9. With this, the deformation can be made easily, in particular, in the narrow width region, i.e., the flange base portion 23, thereby increasing an effect of preventing the optical axis from shifting thereof. In the case where the notches are formed on both side of the flange, it is preferable that a larger one is formed on the opposite side of the flange with respect to the optical axis 9 mentioned above. Therefore, the fixing region and the narrow width region are formed, so that the difference between them formed on a side surface of the flange 11 at the side far from the semiconductor laser element 3, is larger than that formed on a side surface of the flange 11 at the side near to the semiconductor laser element 3. Herein, the fixing region has a distance L3 measured by passing through at the maximum diameter of the tapped hole 12 as the fixing portion, and the length of the narrow width region can be made to be L2.

Also, as is shown in FIG. 4, assuming that a length of the notch formed at the base portion of the flange is $L_1$, and that a length of the base portion of the flange is $L_2$, then it is preferable that the notch length of the flange satisfies a relationship, i.e., $L_1 > L_2$. With this, the rigidity of the flange base portion comes down, sufficiently, so that it can be deformed easily, thereby increasing an effect of preventing the optical axis from shifting. However, if $L_2 < 0.5\ L_1$, the rigidity comes down to be weak too much at the flange base portion, and there may occur a possibility that the flange fails to achieve the function of fixing the semiconductor laser module on the heat radiation substrate. If power for fixing the semiconductor laser module onto the heat radiation substrate is too weak, contacting power between a bottom surface of the stem and that of the substrate goes down, and it increases thermal resistance from the stem bottom surface to the substrate, thereby lowering an effect of radiating the heat of the laser element. Therefore, it is preferable that the length $L_2$ of the flange base portion is $L_2 > 0.5\ L_1$. For example, in a case where the width of the flange is 3 mm, it is enough that 1 mm $\leq L_1 \leq 1.5$ mm.

It is also preferable that thickness at the flange base portion is equal or less than one-twelfth (1/12) of the length of a long side of the frame. For example, if the long side length of the frame is 12 mm, preferably, the thickness is equal or less than 1 mm. With this, the flange base portion 23 can be deformed easily, thereby increasing the effect of preventing the optical axis from being shifted. However, also in case of being too thin, the flange base portion comes to be too weak in the rigidity, therefore there occurs a possibility that the flange looses the function of fixing the semiconductor laser module on the heat radiation substrate, therefore it is needed that the thickness of the flange at the base portion thereof is equal to or greater than 1/24 of the long side length of the frame. This means that, it must be equal or greater than 0.5 mm, if the frame long side is 12 mm in length.

Also, in this case, it is preferable to form the fixing region at the position, where the tapped hole 12 is disposed, to be thicker than others.

Also, the frame 9 has a squire or quadrilateral shape or a polygon shape, mainly. It has a first flange 11 connecting to a first main side of the frame 9, which has a connecting portion of the optical fiber, and a second flange 11 connecting to a second main side of the frame 9, opposing to the first main side. The first flange 11 is provided in a first area (A1) on the first main side, which is divided by an elongated line of that connecting between the semiconductor laser element 3 and a portion where the optical fiber of the optical fiber fixing portion 6 is disposed, while no flange is provided in a second area (A2) located at opposite side of the first area mentioned above and a third area (A3) located on a side of the first area on the second side of the frame, and then a second flange is provided in a fourth area (A4) located on a side of the second area.

It is also preferable that, the bottom surface 21 of the frame contacting with the heat radiation substrate 10, the bottom surface 22 of the flange, and the bottom surface 20 of the stem are machined to be flat to be equal or less than 4 $\mu$m in flatness thereof. It can be machined through, such as, the gliding process, for example. In this case, in particular when the frame 9 and the stem 4 are bonded with the brazing material, such as, silver brazing, etc., even if bending occurs on the bottom surface of module, which is made up with the frame bottom surface 21, the stem bottom surface 20 and the flange bottom surface 22, due to the temperature difference from a melting point of the silver brazing(i.e., 780° C.) down to a room temperature and the difference in the coefficient of linear expansion between the frame 9 and the stem 4 (in case that the frame is made of iron-nickel-cobalt alloy and the stem of cupper-tungsten alloy, bending upward in a convex manner), however according to the semiconductor module of the optical transmitter according to the present invention, since the bottom surface of the module is machined to be flat after connecting the frame 9 and the stem 4 through silver brazing, as was mentioned in the above, no bending stress is applied onto the semiconductor module, even when being fixed onto the heat radiation substrate by the screw, therefore the optical axis thereof is prevented from shifting.

Also, according to the present embodiment, though showing a case where two (2) pieces of flanges are used for fixing by the screw, as the semiconductor module 2 fitted to small-sizing of the optical transmitter, however according to the present invention, the similar effect can be obtained, by adjusting the thickness and/or the width of the flange base portion, which will be shown later, if the flanges are three (3) or more in the number thereof.

Next, assuming that the coefficients of linear expansion of the frame 9, the stem 4 and the heat radiation substrate 10 are $\alpha_1$, $\alpha_2$ and $\alpha_3$, respectively, then explanation will be given on each of the cases, when a relationship is established in the magnitude thereof in among them.

(1) In a case where $\alpha_1 < \alpha_2 < \alpha_3$ (or, $\alpha_1 > \alpha_2 > \alpha_3$), explanation will be given, by referring to FIG. 4. When such the relationship (i.e., $\alpha_1 < \alpha_2 < \alpha_3$ (or, $\alpha_1 > \alpha_2 > \alpha_3$)) as was mentioned above can be established in the coefficients of linear expansion is a case where, for example, the frame 9 is made of iron-nickel-cobalt alloy (i.e., the iron-nickel-cobalt alloy, $\alpha_1 = 5.3 \times 10^{-6}/°$ C.), the stem is made of copper-tungsten alloy (i.e., CuW, $\alpha_2 = 8.3 \times 10^{-6}/°$ C.), and the heat radiation substrate 10 is made of aluminum (i.e., $\alpha_3 = 23 \times 10^{-6}/°$ C.).

Also, as is shown in FIG. 5, it is effective to provided a member being smaller than the frame 9 in rigidity (a low rigidity high heat conduction member 25), such as, of heat conductive grease and/or heat conductive elastomer, etc., having heat conductivity being equal or greater than 2W/mK, between the stem bottom surface 22 and the heat radiation substrate 10, for increasing the heat conductivity between the both members.

It is also effective to rise up pressure weight of the semiconductor laser module onto the substrate, by making the cover of the optical transmitter thick in a part thereof. However, in this case, it is preferable to provide a low rigidity high heat conductive member 27, such as, elastomer, etc., between the semiconductor laser module and the thick portion of the cover 26, so as to prevent the weight much more than the desired from applying between the semiconductor laser module and the substrate.

<EXAMPLE 2>

Explanation will be given on other embodiment, by referring to FIGS. 6 and 7.

Basically, although it is possible to make the present embodiment being same to the optical transmitter 28 of the embodiment 1, shown in FIG. 1, however it differs in the shapes of an attachment portion 30 of a flange for use of screwing, for the purpose of attaching the semiconductor laser module 29 and the heat radiation substrate 10 by a screw, and also of a flange 31.

Figure 6:
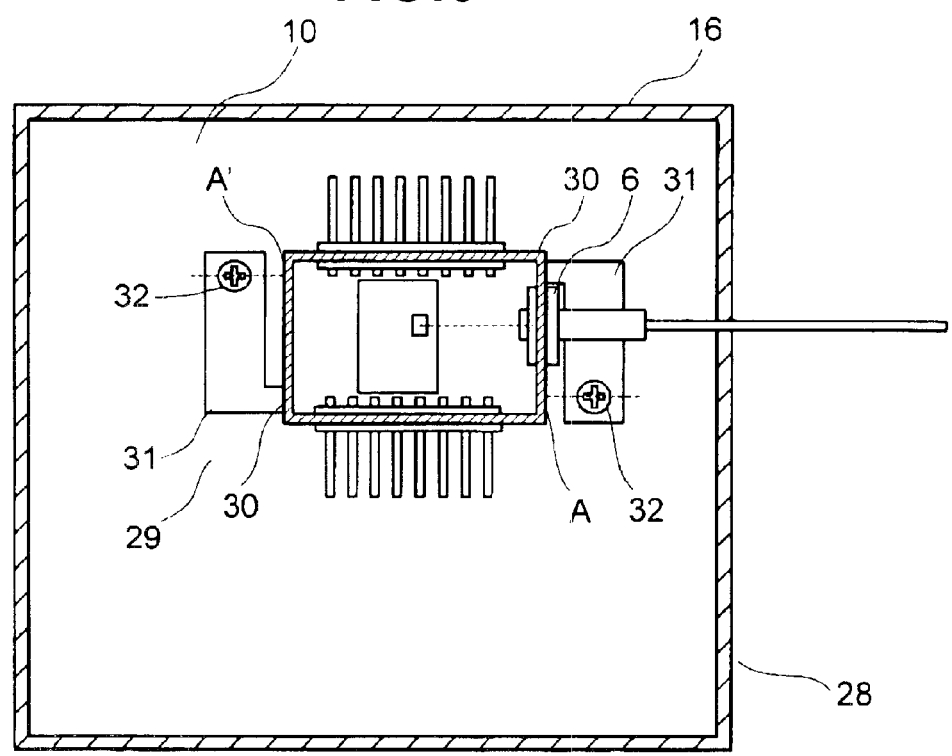
FIG. 6 is a plane view for showing the optical transmitter, according a second embodiment of the present invention.

The semiconductor laser module 29 mounted on the optical transmitter according to the present embodiment has, as is shown in FIG. 6, a first flange connecting to the first main side of the above-mentioned frame 9, a second flange connecting to the second main side of the frame 9, but opposing to the first main side thereof, and further comprises a tapped hole 32 as a fixing portion of the first flange in a first area (A1) of the first main side, which is divided by a line elongating from that connecting between the semiconductor laser element 3 and a portion where the optical fiber at the optical fiber fixing portion 6 is disposed, a connection portion to the frame 9 of the first flange in a second area (A2) located on an opposite side of the first area, and a fixing portion of the second flange mentioned above in a fourth area (A4) located on a side of the second area. Thus, a base portion of the flange mentioned above is formed in a space, to which the tapped hole of the flange belongs, between the two (2) spaces divided into two (2) by a plane, passing through the optical axis of the above-mentioned semiconductor laser element and being vertical to the heat radiation substrate, and on a frame side wall parallel to the optical axis.

The attachment portion of the flange onto the frame is located at a position other than portions (assuming to be a portion A and a portion A') where the vertical lines extending to sidewalls of the frame from the tapped holes formed on the flange portions comes across the sidewalls of the frame, on the nearest sidewall from the tapped hole 32 formed on the flange portion. In FIG. 6, the attachment portion 30 of the flange to the frame is provided at the position extending over an optical fiber fixing portion 6, on the sidewall same to the portion A and the portion A'.

Figure 7:
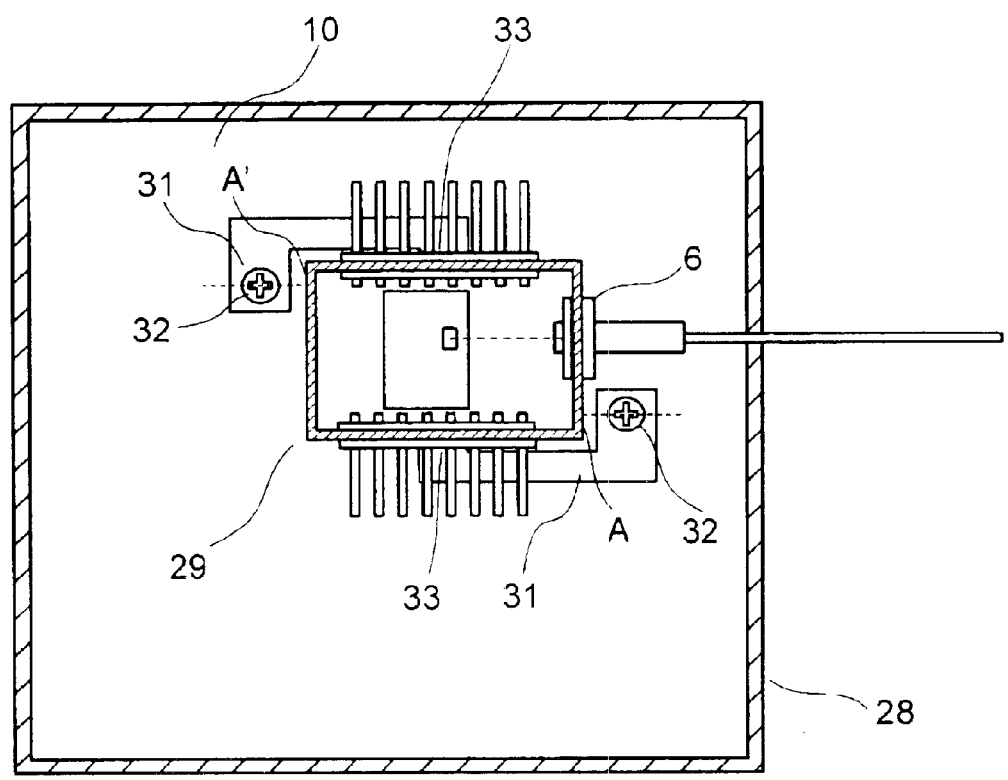
FIG. 7 is also a plane view for showing the optical transmitter, according the second embodiment of the present invention.

As is also shown in FIG. 7, attachment portions 33 of the flange to the frame are provided on the sidewall being different from the portion A and the portion A'. As is shown in FIGS. 6 and 7, further it is possible to elongate the flange, with provision of the flange base portion at a location far from the portion A and the portion A', and with this, in addition to the function and the effect of the embodiment 1, the flange base portion can be deformed, easily, even if the heat radiation substrate is deformed, thereby increasing the effect of preventing the optical axis from shifting.

And, also in this case, as was mentioned in the explanation about the embodiment 1, forming the notch at the flange base portion and/or making the flange base portion thin in the thickness thereof effectively enhance the effect of suppressing the shifting in the optical axis.

Also as was shown in the embodiment 1, for the purpose of increasing adherence between the semiconductor module and the heat radiation substrate, it is preferable to provide a member, having good heat conductivity and low rigidity, such as elastomer, etc., for example, between the module and the substrate.

<EXAMPLE 3>

Explanation will be given on other embodiment, by referring to FIGS. 8 and 9.

Figure 8:
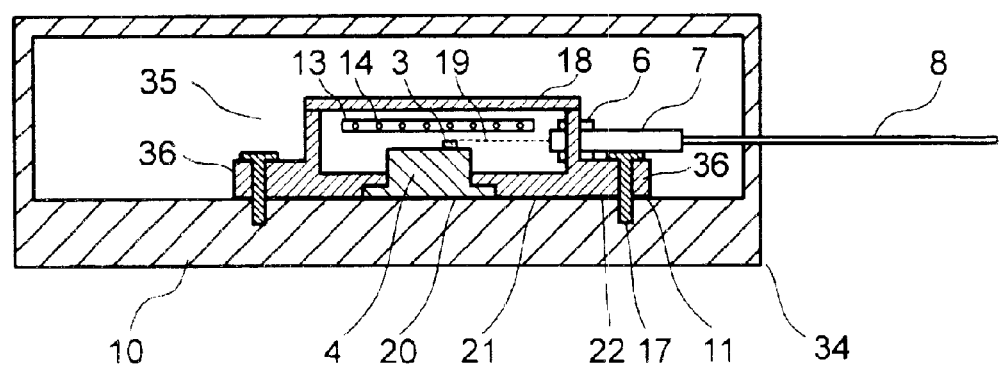
FIG. 8 is across-section view for showing principle portion of the optical transmitter, according to a third embodiment of the present invention.

The semiconductor laser module 35, which is mounted on the optical transmitter 34 according to the present embodiment, has a flange 36, as shown in FIG. 8, being thicker than the thickness of the bottom plate portion of the semiconductor laser module 35 connecting to the frame 9, thereby having high rigidity at the flange 36. Since the flange portion is thick in the thickness and has high rigidity, the force due to bending of the heat radiation substrate is transmitted to the semiconductor laser module, easily. With this, in addition to the effect obtained by the embodiment 1, it is possible to suppress the deformation of the semiconductor laser module, and thereby inhibit the shifting of the optical axis.

In the present embodiment, preferably, they are constructed so as to establish the following relationship; $\alpha_2<\alpha_1$, $\alpha_2<\alpha_3$ (or $\alpha_2<\alpha_1$, $\alpha_2<\alpha_3$). An example, satisfying such the relationship among the coefficients of linear expansion (i.e., $\alpha_2<\alpha_1$, $\alpha_2<\alpha_3$ (or $\alpha_2<\alpha_1$, $\alpha_2<\alpha_3$), is in such a case, where the frame is made of aluminum ($\alpha_2=23\times10^{-6}/°$ C.), the stem is made of copper tungsten alloy ($\alpha_2=8.3\times10^{-6}/°$ C.), and the heat radiation substrate is made of aluminum ($\alpha_3=23\times10^{-6}/°$ C.), for example.

In a case where the environment temperature is high, in which the optical transmitter 34 is used, or in a case where the semiconductor laser element 3 is driven, the semiconductor laser module 35 tries to deform or bend upward in convex-like shape, due to the difference in the coefficient of linear expansion between the aluminum ($\alpha_1=23\times10^{-6}/°$ C.) building up the frame and CuW ($\alpha_2=8.3\times10^{-6}/°$ C.) building up the stem. However, since the coefficient of linear expansion $\alpha_3$ of the heat radiation substrate is larger than that $\alpha_1$ of the stem, then it bends upward in convex-like shape so as to cancel the bending of the semiconductor laser module 2 upward in convex-like shape. Herein, since the flange portion is thick in the thickness and it has high rigidity, the force due to the bending of the heat radiation substrate can be transmitted, easily to the semiconductor laser module. With this, it is possible to suppress the deformation of the semiconductor laser module, thereby inhibiting the shifting in the optical axis.

In the similar manner, in a case where the environment temperature is low in use of the optical transmitter 34, the semiconductor laser module 35 tries to deform or bend downward in convex-like shape, due to the difference in the coefficient of linear expansion between the aluminum ($\alpha_1=23\times10^{-6}/°$ C.) building up the frame and CuW ($\alpha_2=8.3\times10^{-6}/°$ C.) building up the stem, while since the coefficient of linear expansion $\alpha_3$ of the heat radiation substrate is larger than that a, of the stem, the heat radiation substrate bends upward in convex-like shape, thereby canceling the bending of the semiconductor laser module 2 downward in convex-like shape. Herein, since the flange portion is thick in the thickness and it has high rigidity, the force due to the bending of the heat radiation substrate can transfer, easily to the semiconductor laser module. With this, it is possible to suppress the deformation of the semiconductor laser module, thereby inhibiting the shifting in the optical axis.

Figure 9:
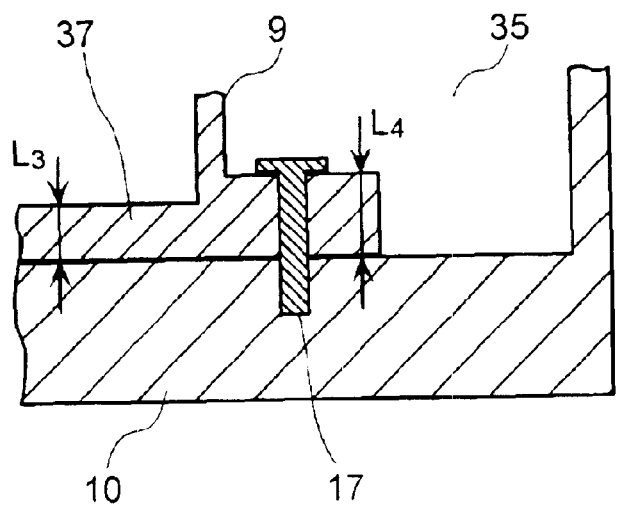
FIG. 9 is an enlarged view for showing the flange portion of the semiconductor laser module of the same optical transmitter.

Also, as is shown in FIG. 9, so as to enhance the effect of suppressing the deformation in the semiconductor laser-module,-it is preferable to satisfy the relationship; $L_4>L_3$, if assuming that $L_3$ is the thickness of the bottom plate portion 37 of the semiconductor laser module and $L_4$ the thickness of the flange. It is also preferable that the thickness of the bottom plate portion 37 is equal or less than 2 mm. With this, the stem can be fixed strongly, thereby enhancing the effect of inhibiting the shifting in the optical axis.

<EXAMPLE 4>

Explanation will be made on other embodiment, by referring to FIG. 10.

Figure 11:
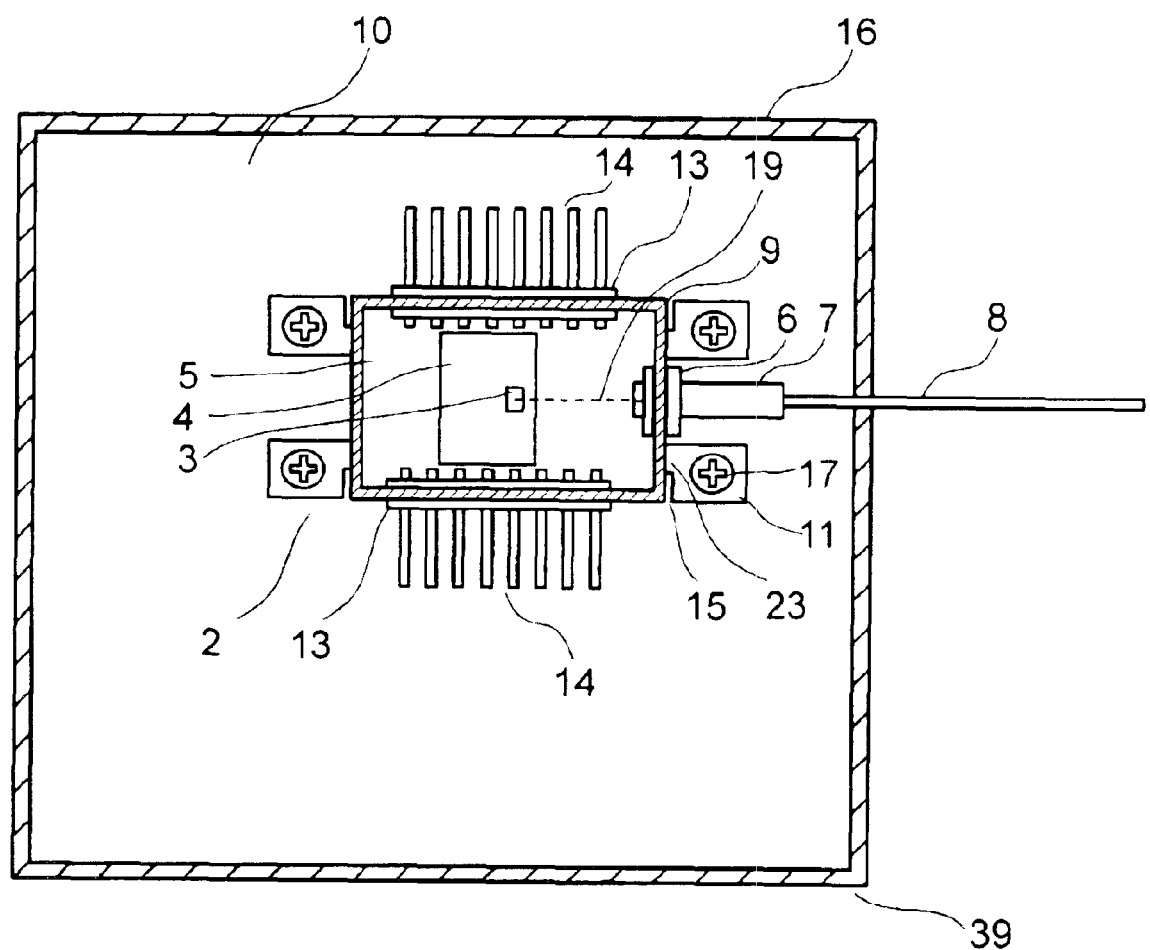
FIG. 11 is a plane view for showing of an optical transmitter, according to a fifth embodiment of the present invention.

The present embodiment differs from the optical transmitter 28 according to the embodiment 1, which is shown in FIG. 1, in particular, in the mounting method of the stem on a substrate. In the optical transmitter 1 shown in the embodiment 1, the hole portion is formed on the substrate, so as to connect the stem on the heat radiation substrate 10, directly. On the contrary thereto, the stem 4 of the optical transmitter according to the present embodiment, which is shown in FIG. 11, is bonded on the heat radiation substrate 10 through the substrate 5. With this, since the substrate 5 has no hole portion therein, it is possible to bring the rigidity of the substrate to be larger than that of the substrate shown in the embodiment 1, enabling reduction in the thermal deformation of the substrate 5 generated due to the difference in the coefficient of linear expansion between the heat radiation substrate and the semiconductor laser module, and thereby enabling to suppress the shifting in the optical axis. Also, with the flange portion, since the cut portion (or a notch) is formed in the similar manner to the embodiment 1, therefore it is possible to inhibit the shifting in the optical axis through the mechanism being similar to that in the embodiment 1.

<Embodiment 5>

Further other embodiment will be explained by referring to FIGS. 11 to 13.

Figure 10:
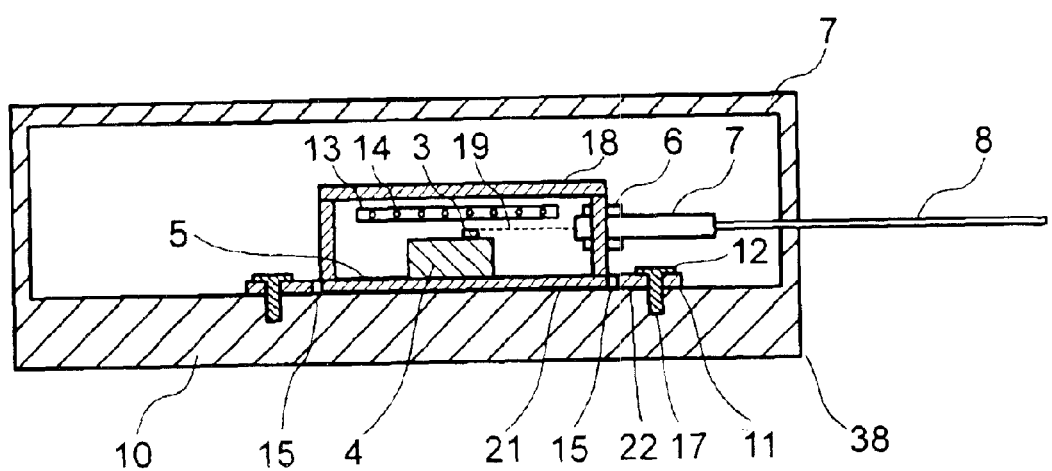
FIG. 10 is a cross-section view of the principle portion of an optical transmitter, according to a fourth embodiment of the present invention.

The present embodiment differs from the optical transmitter 28 according to the embodiment 1, which is shown in FIG. 1, and the optical transmitter 38 according to the embodiment 4, which is shown in FIG. 10, in particular, in the number of flanges for use in screwing the semiconductor laser module onto the heat radiation substrate.

The semiconductor laser module 40, which is mounted on the optical transmitter 39 according to the present embodiment, has flange portions, as shown in FIG. 11, at the base portion of each of which is formed the notch 15 for defining the narrow width region. With forming the narrow width region through the notch at the base portion of the flange mentioned above, the rigidity of the base portion mentioned above is made to be smaller than those of the substrate and the frame mentioned above, in particular, to the deformation caused in the horizontal direction along the substrate 10.

Due to this, even if the thermal deformation is caused on the semiconductor laser module 40, accompanying the driving of the semiconductor laser and the changing of environment temperature thereof, due to the difference in the coefficient of linear expansion between the heat radiation substrate 10 and the semiconductor laser module 40, the thermal deformation mentioned above is absorbed at the flange base portion; therefore it is possible to prevent the thermal deformation from reaching to the frame. With this, the shifting in the optical axis can be prevented, which is caused when driving the semiconductor laser, and also accompanying the changing of the environment temperature thereof.

Figure 12A:
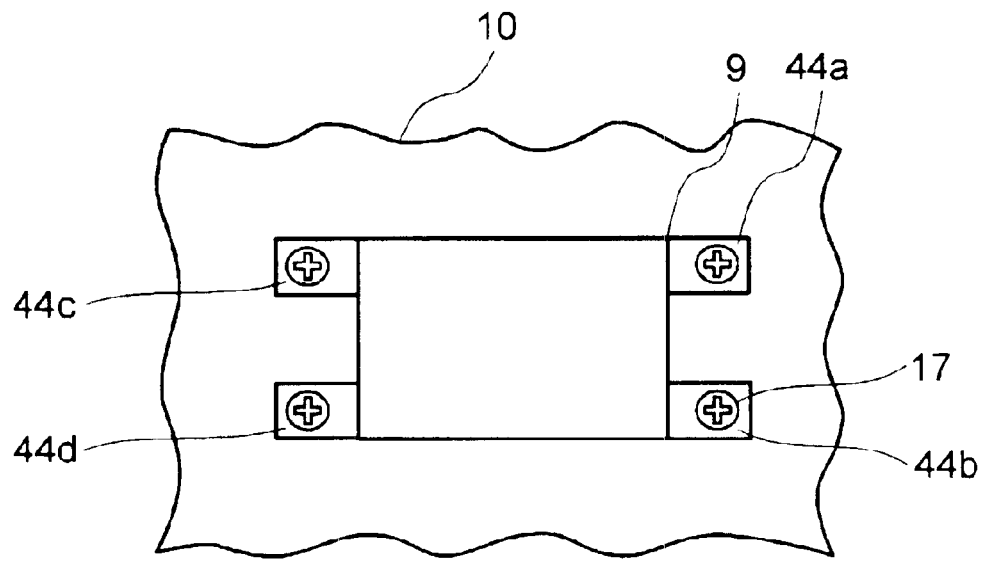
FIGS. 12(a) and 12(b) are plane views for showing thermal deformation in the optical transmitter.
Figure 12B:
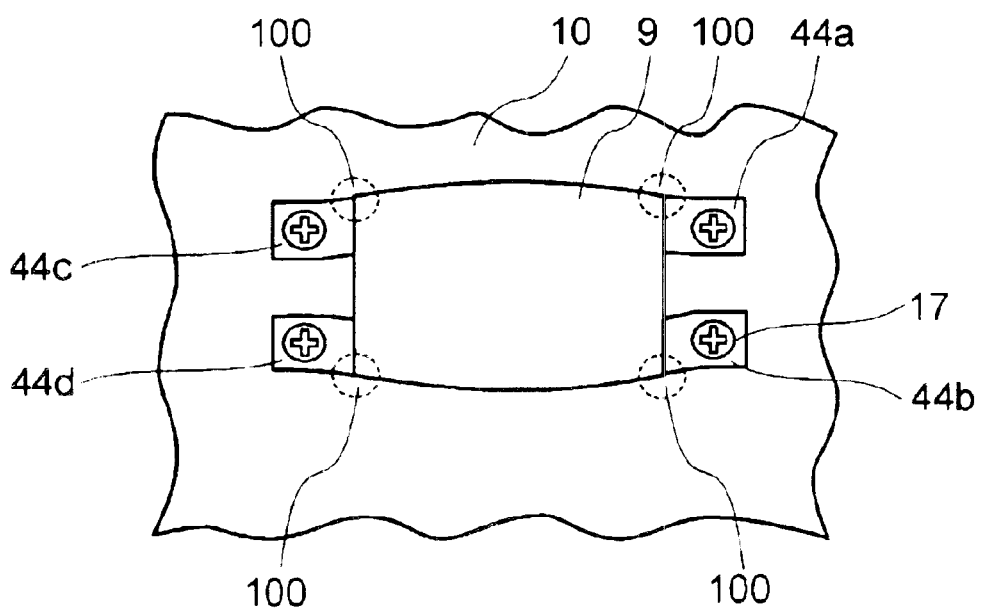
Figure 13A:
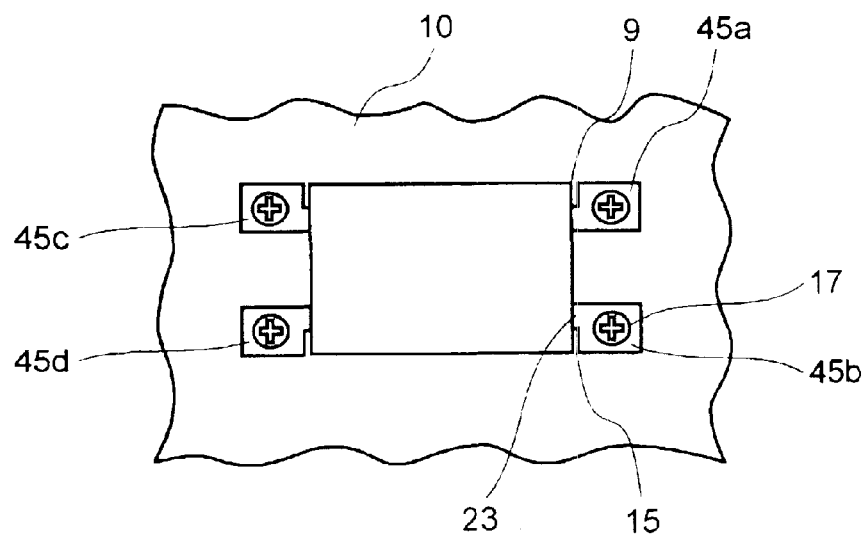
FIGS. 13(a) and 13(b) are also plane views for showing the thermal deformation in the optical transmitter.
Figure 13B:
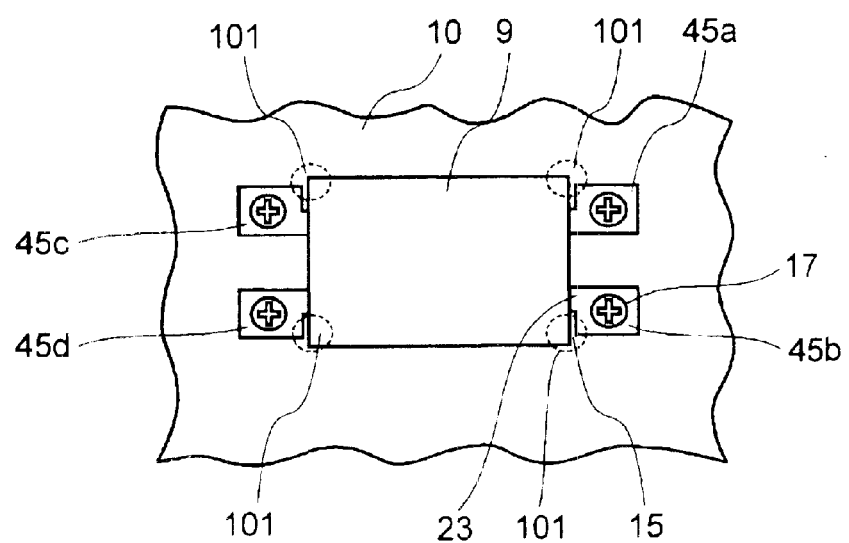

Explanation will be given on the effect of absorbing the thermal deformation at the flange base portion shown in the above, by referring to FIGS. 12(a) and 12(b) and FIGS. 13(a) and 13(b). FIGS. 12(a) and 12(b) are views for showing the thermal deformation caused when driving the semiconductor laser of the optical transmitter according to the present embodiment, and also due to the changing of the environment temperature thereof, and in particular, FIG. 12(a) shows that before deformation occurs while FIG. 12(b) after deformation. Herein, there is provided a heat radiation substrate 10, a semiconductor laser module 40, and also flanges 44a, 44b, 44c and 44d for use in attaching those mentioned above by means of screws 17. Also, there is provided a main portion where the semiconductor laser element of the semiconductor laser module 40 is mounted on. Herein, for convenience of explanation, parts other than those mentioned above are omitted from the drawing. In the optical transmitter according to the present invention, each of the flanges 44a, 44b, 44c and 44d is provided with the notch at the connection portion with the main body of the semiconductor laser module. Also, the notch mentioned above is formed in the flange base portion, in particular, on a side at a corner portion of the module main body. Also, FIGS. 13(a) and 13(b) show the thermal deformation caused when the semiconductor laser is driven, and also due to the changing of the environment temperature thereof, on the optical transmitter having no such the notch in the flanges 45a, 45b, 45c and 45d, as a comparison example, and in particular, FIG. 13(a) shows that before deformation occurs while FIG. 13(b) after deformation. Also, any one of the figures showing the deformation mentioned above shows an example of the thermal deformation in the case where the coefficient of linear expansion of the heat radiation substrate is larger than that of the frame of the semiconductor laser module (in a case where the heat radiation substrate made of aluminum is $26 \times 10^{-6}/°$ C. in the coefficient of linear expansion and the frame made of iron-nickel-cobalt alloy $5.3 \times 10^{-6}/°$ C. in the coefficient of linear expansion, for example), and when the temperature goes down from high to low.

First of all, in the case there is formed no such notch in the flange, as shown in FIG. 12(b), since the heat radiation substrate is large in an amount of heat shrinkage, comparing to that of the semiconductor laser module, the distance is reduced between the flanges 44a and 44b and between the flanges 44c and 44d. Accompanying with this, the module main body 43 is dragged at the corners 101, thereby deforming. With this deforming, strain is produced in the module main body 43, and as a result of this, causing the shifting in the optical axis.

On the other hand, also in the case there is provided the notch in the flange, as is shown in FIG. 13(b), since the heat radiation substrate is large in an amount of heat shrinkage, comparing to that of the semiconductor laser module, the distance is reduced between the flanges 45a and 45b and between the flanges 45c and 45d. However, because of forming the notches 15 in the flanges 45a, 45b, 45c and 45d, there occurs no sliding at the corners of the module main body, and therefore stress hardly occurs in the body of the frame 9. As a result of this, the shifting in the optical axis can be suppressed. Also, because the notch is formed in the flange base portion, in particular, on the side at the corner 100 of the module main body, it brings about the effect of suppressing the deformation of the module main body, thereby being effective to prevent the shifting in the optical axis.

As was fully explained in the above, according to the present invention, it is possible to prevent the shifting in the optical axis of the semiconductor laser module due to the thermal stress, effectively.

The present invention may be embodied in other specific forms without departing from the spirit or essential feature or characteristics thereof. The present embodiment(s) is/are therefore to be considered in all respects as illustrative and not restrictive, the scope of the invention being indicated by the appended claims rather than by the forgoing description and range of equivalency of the claims are therefore to be embraces therein.

What is claimed is:

1. A semiconductor laser module, comprising:

a semiconductor laser element;

a frame for storing said semiconductor laser element therein;

an optical fiber fixing portion being connected to said frame; and a flange being connected to said frame, and having a fixing portion for fixing said frame on a substrate, wherein said flange has a narrow width region between a fixing region, including a fixing portion with said substrate therein, and said frame, and said narrow width region is narrower than width of said fixing region; and wherein:

said frame has a polygonal shape, said flange has a first flange connecting to a first main side of said frame and a second flange connecting to a second main side of said frame opposing to said first main side thereof, said first flange is provided in a first region on said first main side, which is divided by an elongated line of a line connecting a portion where said semiconductor laser element is disposed and a portion where an optical fiber of said optical fiber fixing portion is disposed, while no flange is provided in a second region located on a reverse side of said first region, and no flange is provided in a third region located on the second main side of said frame on a side of said first region, opposing to said first main side, while said second flange is provided in a fourth region located on a side of said second region.

2. The semiconductor laser module, as defined in the claim 1, wherein:

said frame has a polygonal shape, said flange has a first flange connecting to a first main side of said frame and a second flange connecting to a second main side of said frame opposing to said first main side thereof, the connecting portion of said first flange to said frame and said connecting portion of said first flange are disposed in a first region on said first main side, which is divided by an elongated line of a line connecting a portion where said semiconductor laser element is disposed and a portion where an optical fiber of said optical fiber fixing portion is disposed, the connecting portion of said second flange to said frame and said connecting portion of said second flange are disposed in a fourth region, locating at a side of said second region on the second main side of said frame opposing to said first side thereof.

3. The semiconductor laser module, as defined in the claim 1, wherein:

said frame has a polygonal shape, said flange has a first flange connecting to a first main side of said frame and a second flange connecting to a second main side of said frame opposing to said first main side thereof, the connecting portion of said first flange to said frame and said fixing portion of said first flange are provided in a first region on said first main side, which is divided by an elongated line of a line connecting a portion where said semiconductor laser element is disposed and a portion where an optical fiber of said optical fiber fixing portion is disposed, and the connecting portion of said second flange to said frame and said fixing portion of said flange are provided in a fourth region located on a side of said second region on the second main side of said frame, opposing to said first main side.

4. The semiconductor laser module, as defined in the claim 1, wherein said fixing region and said narrow width region are so formed that difference between those on a side surface of said flange at a side far from said semiconductor element is larger than that between said fixing region and said narrow width region on the side surface of said flange at a side near to said semiconductor element.

5. The semiconductor laser module, as defined in the claim 1, wherein thickness of said flange in said narrow width region is formed to be thinner than that in said fixing region thereof.

6. A semiconductor laser module comprising:

a semiconductor laser element;

a polygonal frame for holding the semiconductor laser element therein;

an optical fiber fixing portion connected to the frame;

a flange connected to the frame, and having a fixing portion for fixing the frame on a substrate, wherein the flange has a narrow width region between a fixing region, including a fixing portion with the substrate and the frame, and the narrow width region is narrower than width of the fixing region;

wherein the flange includes a first flange connecting to a first main side of the frame and a second flange connecting to a second main side of the frame opposing the first main side;

the first flange is provided in a first region on the first main side, which is divided by an elongated line of a line connecting a portion where the semiconductor laser element is disposed and a portion where an optical fiber of the optical fiber fixing portion is disposed, while no flange is provided in a second region located on a reverse side of the first region, and no flange is provided in a third region located on the second main side of the frame on a side of the first region, opposing to the first main side, while the second flange is provided in a fourth region located on a side of the second region.

7. A semiconductor laser module comprising:

a semiconductor laser element;

a frame having a polygonal shape for holding the semiconductor laser element therein;

an optical fiber fixing portion connected to the frame; and a flange connected to the frame, and having a fixing portion for fixing the frame on a substrate, wherein the flange has a narrow width region between a fixing region, including a fixing portion with the substrate therein and the frame, and the narrow width region is narrower than width of the fixing region;

the flange has a first flange connecting to a first main side of the frame and a second flange connecting to a second main side of the frame opposing to the first main side thereof, the connecting portion of the first flange to the frame and the connecting portion of the first flange are disposed in a first region on the first main side, which is divided by an elongated line of a line connecting a portion where the semiconductor laser element is disposed and a portion where an optical fiber of the optical fiber fixing portion is disposed, the connecting portion of the second flange to the frame and the connecting portion of the second flange are disposed in a fourth region located at a side of the second region on the second main side of the frame opposing to the first side thereof.

8. A semiconductor laser module comprising:

a semiconductor laser element;

a polygonal frame for holding the semiconductor laser element therein;

an optical fiber fixing portion connected to the frame; and a flange connected to the frame, and having a fixing portion for fixing the frame on a substrate, wherein the flange has a narrow width region between a fixing region, including a fixing portion with the substrate therein, and the frame, and the narrow width region is narrower than width of the fixing region;

the flange includes a first flange connecting to a first main side of the frame and a second flange connecting to a second main side of the frame opposing to the first main side thereof;

the connecting portion of the first flange to the frame and the fixing portion of the first flange are provided in a first region on the first main side, which is divided by an elongated line of a line connecting a portion where the semiconductor laser element is disposed and a portion where an optical fiber of the optical fiber fixing portion is disposed; and the connecting portion of the second flange to the frame and the fixing portion of the flange are provided in a fourth region located on a side of the second region on the second main side of the frame, opposing to the first main side.

9. A semiconductor laser module comprising:

a semiconductor laser element;

a frame for holding the semiconductor laser element therein;

an optical fiber fixing portion connected to the frame; and a flange connected to the frame, and having a fixing portion for fixing the frame on a substrate, wherein the flange has a narrow width region between a fixing region, including a fixing portion with the substrate therein, and the frame, and the narrow width region is narrower than width of the fixing region;

wherein the fixing region and the narrow width region are so formed that difference between those on a side surface of the flange at a side far from the semiconductor element is larger than that between the fixing region and the narrow width region on the side surface of the flange at aside near to the semiconductor element.

10. A semiconductor laser module comprising:

a semiconductor laser element;

a frame for holding the semiconductor laser element therein;

an optical fiber fixing portion connected to the frame;

a flange connected to the frame, and having a fixing portion for fixing the frame on a substrate, wherein the flange has a narrow width region between a fixing region, including a fixing portion with the substrate and the frame, and the narrow width region is narrower than width of the fixing region; and wherein thickness of the flange in the narrow width region is thinner than that in the fixing region thereof.

* * * * *